(12) United States Patent
Fulkerson

(10) Patent No.: US 6,252,426 B1
(45) Date of Patent: Jun. 26, 2001

(54) HIGH SPEED LOGIC FAMILY

(75) Inventor: David E. Fulkerson, Chanhassen, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/520,307

(22) Filed: Mar. 7, 2000

(51) Int. Cl.$^7$ .......................... H03K 19/094; H03K 19/20
(52) U.S. Cl. ............................................. 326/113; 326/104
(58) Field of Search .......................... 326/113–114, 104, 326/119, 121, 112

(56) References Cited

U.S. PATENT DOCUMENTS

| | | | |
|---|---|---|---|
| 4,710,649 | * 12/1987 | Lewis | 326/113 |
| 5,594,364 | * 1/1997 | Chan et al. | 326/39 |
| 5,787,011 | 7/1998 | Ko | 364/490 |
| 5,808,483 | 9/1998 | Sako | 326/113 |
| 6,011,411 | * 1/2000 | Hokazono | 326/113 |

FOREIGN PATENT DOCUMENTS

403079124A * 4/1991 (JP).

OTHER PUBLICATIONS

Suzuki et al., "A 1.5–ns 32–b CMOS ALU in Double Pass–Transistor Logic", IEEE Journal of Solid–state Circuits, vol. 28, No. 11, Nov. 1993, pp. 1145–1151.

* cited by examiner

Primary Examiner—Michael Tokar
Assistant Examiner—James A. Cho
(74) Attorney, Agent, or Firm—Kris T. Fredrick

(57) ABSTRACT

A logic family is disclosed that produces the same advantages as Dual Pass-Transistor Logic (DPL), but uses fewer transistors and provides increased performance relative to DPL. This is accomplished by removing one or more of the transistors from a typical DPL gate. Because fewer transistors are used, circuits constructed in accordance with the present invention may have increased performance and increased density relative to DPL.

24 Claims, 6 Drawing Sheets

HIGH SPEED LOGIC FAMILY

BACKGROUND OF THE INVENTION

The present invention generally relates to digital logic families, and more particularly, to digital logic families for high speed circuits.

Moore's Law, which is named after the founder of Intel Corporation, Gordon Moore, states that the speed and density of computers will double every 18–24 months. For the most part, Moore's Law has held true since the early days of the microprocessor, and is predicted to do so for at least another twenty years.

A corollary to Moore's Law is that the size of the transistors used in integrated circuits must shrink by a factor of two every 18–24 months. Until recently, this was accomplished by simply scaling bulk MOSFET devices. However, as the transistor channel lengths scale below about 0.25 um, a number of transistor effects begin to degrade the transistor's characteristics. Some of these effects include short-channel effects, gate resistance effects, channel profiling effects and other effects. It has been found that reducing the power supply voltage can reduce some of these effects, but the performance of the resulting circuit also tends to suffer.

A number of logic families have been proposed for producing higher performance circuits, some of which use pass-transistor logic. Pass-transistor logic families often can implement a desired logic function using fewer transistors than conventional CMOS logic. One common pass-transistor logic family is known as Complementary Pass-transistor Logic (CPL), and is discussed in U.S. Pat. No. 5,808,483 to Sako and in "A 1.5-ns 32-b CMOS ALU in Double Pass-Transistor Logic" by Suzuki et al. A typical CPL logic gate uses only NMOS transistors to produce relatively low input capacitances and relatively high performance circuits.

A limitation of many pass-transistor logic families, including CPL is that the high output signal level tends to be lower than the supply voltage by an NMOS threshold voltage. This reduces the noise margin of the circuit, and in turn, the speed of the circuit. The usual way to avoid this is to use CMOS Pass-Transistor Logic, where full-swing operation is achieved by adding PMOS transistors in parallel with the NMOS transistors of a CPL gate. This, however, produces higher input capacitance and slower circuit performance.

Another pass-transistor logic family is called Dual Pass-Transistor Logic (DPL). Dual Pass-Transistor Logic (DPL) is a modified version of CPL, and is often used for reduced supply voltage applications. Unlike CPL, DPL uses both NMOS and PMOS pass-transistors. A typical DPL AND/NAND gate is shown in FIG. 1, with the NAND gate shown at 100 and the AND gate shown at 102. Both the NAND gate 100 and the AND gate 102 use complementary input signals A, $\overline{A}$, B and $\overline{B}$.

For the NAND gate 100, input A is coupled to the gate terminals of NMOS transistor 104 and PMOS transistor 106. PMOS transistor 106 has a source that is coupled to a power supply voltage (VDD) 107, and a drain that is coupled to an output terminal 112. NMOS transistor 104 has a source that is coupled to the input $\overline{B}$, and a drain that is coupled to the output terminal 112.

Input B is coupled to the gate terminals of NMOS transistor 108 and PMOS transistor 110. PMOS transistor 110 has a source that is coupled to the power supply voltage (VDD) 107, and a drain that is coupled to the output terminal 112. NMOS transistor 108 has a source that is coupled to input $\overline{A}$, and a drain that is coupled to the output terminal 112.

For the AND gate 102, input $\overline{A}$ is coupled to the gate terminals of NMOS transistor 120 and PMOS transistor 122. NMOS transistor 120 has a source that is coupled to ground 123, and a drain that is coupled to output terminal 124. PMOS transistor 122 has a source that is coupled to the input B, and a drain that is coupled to the output terminal 124.

Input $\overline{B}$ is coupled to the gate terminals of NMOS transistor 126 and PMOS transistor 128. NMOS transistor 126 has a source that is coupled to ground 123, and a drain that is coupled to the output terminal 124. PMOS transistor 128 has a source that is coupled to input A, and a drain that is coupled to the output terminal 124.

Dual Pass-Transistor Logic (DPL) can produce higher circuit performance than CPL because dual current paths are available for driving the output of the gate. For example, for the NAND gate 100 shown in FIG. 1, when inputs A and B are both low, PMOS transistor 106 and PMOS transistor 110 are both "on". Thus, PMOS transistor 106 provides a first current path for pulling the output terminal 112 high, and PMOS transistor 110 provides a second current path for pulling the output terminal 112 high.

When input A is low and input B is high, PMOS transistor 106 is "on", and NMOS transistor 108 is "on" with the drain pulled high (i.e., input $\overline{A}$ is high). Accordingly, PMOS transistor 106 provides a first current path for pulling output 112 high, and NMOS transistor 108 provides a second current path for pulling the output terminal 112 high.

When input A is high and input B is low, PMOS transistor 110 is "on", and NMOS transistor 104 is "on" with the drain pulled high (i.e., input $\overline{B}$ is high). Accordingly, PMOS transistor 110 provides a first current path for pulling output terminal 112 high, and NMOS transistor 104 provides a second current path for pulling output terminal 112 high.

Finally, when input A and input B are both high, NMOS transistor 104 is "on" and NMOS transistor 108 is "on", both with their drains pulled low (i.e., both $\overline{A}$ and $\overline{B}$ are low). As such, NMOS transistor 104 provides a first current path for pulling the output terminal 112 low, and NMOS transistor 108 provides a second current path for pulling the output terminal 112 low.

The dual current paths provided by DPL are thought to increase the performance of DPL relative to CPL. In addition, the dual current paths are thought to allow rail-to-rail switching, which may increase the noise margin and performance of DPL relative to CPL, especially under reduced power supply conditions.

SUMMARY OF THE INVENTION

The present invention provides a logic family that produces the same advantages as DPL, but uses fewer transistors and provides increased performance relative to DPL. This is preferably accomplished by removing one or more of the transistors from DPL. It has been found that not all of the transistors in DPL may be required, and in many cases, some of the transistors reduce the performance and density of the gate. This observation is counter to the general understanding of DPL logic gates, because the removal of one or more of the transistors from a DPL gate may eliminate one or more of the dual current paths discussed above. It is the dual current paths that were thought to be beneficial for increasing the performance of DPL. It has been discovered, however, that a DPL gate may not operate as a collection of independent pass transistors. Rather, it appears there is an interaction between the pass-transistors that produces gain, much like a CMOS gate. Thus, it has also been found that if selected transistors are removed from a typical DPL gate, the gate can still provide the desired logic function, but at higher speeds and with higher densities.

In a first illustrative embodiment of the present invention, a two-input logic circuit is provided. The illustrative two-input logic circuit includes a first transistor, a second transistor, and a third transistor. The first transistor and second transistor have a first polarity, and the third transistor has a second polarity. The source of the first transistor is coupled to a power supply voltage, the drain of the first transistor is coupled to the output of the logic circuit, and the gate of the first transistor is coupled to a first input signal. The source of the second transistor is coupled to the power supply voltage, the drain of the second transistor is coupled to the output of the logic circuit, and the gate of the second transistor is coupled to a second input signal. Finally, the source of the third transistor is coupled to a third input signal, the drain of the third transistor is coupled to the output of the logic circuit, and the gate of the third transistor is coupled to the first input signal. Preferably, the third input signal is the complement of the second input signal.

Unlike a conventional two-input DPL gate, the logic circuit does not have a fourth transistor, where the source of the fourth transistor is coupled to the complement of the first input signal, the drain of the fourth transistor is coupled to the output of the logic circuit, and the gate of the fourth transistor is coupled to the second input signal. As such, the present invention uses fewer transistors than conventional DPL gates.

For a two-input NAND gate (A NAND B), the first transistor and second transistor are P-type transistors (e.g., PMOS), the third transistor is an N-type transistor (e.g., NMOS), and the power supply voltage is VDD (e.g., 3.3V). The first input signal, which is provided to the gate of the first transistor (P-type), may correspond to the B input. The second input signal, which is provided to the gate of the second transistor (P-type) and to the gate of the third transistor (N-type), may correspond to the A input. The third input signal, which is provided to the source of the third transistor (N-type), may correspond to the complement of the B input, or $\overline{B}$.

For a two-input OR gate (A OR B), the polarity of the input signals may be simply reversed relative to the two-input NAND gate discussed above. For example, the first input signal, which is provided to the gate of the first transistor (P-type), may correspond to the complement of the B input, or $\overline{B}$. The second input signal, which is provided to the gate of the second transistor (P-type) and to the gate of the third transistor (N-type), may correspond to the complement of the A input, or $\overline{A}$. The third input signal, which is provided to the source of the third transistor (N-type), may correspond to the B input.

For a two-input NOR gate, (A NOR B), the first transistor and second transistor are N-type transistors (e.g., NMOS), the third transistor is a P-type transistor (e.g., PMOS), and the power supply voltage is ground. The first input signal, which is provided to the gate of the first transistor (N-type), may correspond to the B input. The second input signal, which is provided to the gate of the second transistor (N-type) and to the gate of the third transistor (P-type), may correspond to the A input. The third input signal, which is provided to the source of the third transistor (P-type), may correspond to the complement of the B input, or $\overline{B}$.

For a two-input AND gate (A AND B), the polarity of the input signals may be simply reversed relative to the two-input NOR gate discussed above. That is, the first input signal, which is provided to the gate of the first transistor (N-type), may correspond to the complement of the B input, or $\overline{B}$. The second input signal, which is provided to the gate of the second transistor (N-type) and to the gate of the third transistor (P-type), may correspond to the complement of the A input, or $\overline{A}$. The third input signal, which is provided to the source of the third transistor (P-type), may correspond to the B input.

In some embodiments, the third transistor may be coupled to the third input signal through one or more other transistors, preferably of the second polarity type. For example, for a three-input NAND gate, the source of the third transistor may be coupled to the drain of a fourth transistor, with the source of the fourth transistor coupled to the third input signal. The gate of the fourth transistor may then be coupled to a fourth input signal, such as a C input. To complete the three-input NAND gate, a fifth transistor may be provided, with the gate of the fifth transistor coupled to the C input, the source of the fifth transistor coupled to the power supply voltage, and the drain of the fifth transistor coupled to the output of the gate.

The above-described logic circuits are only illustrative. With the accompanying disclosure, one skilled in the art could derive numerous other logic functions to form a logic family.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 2:
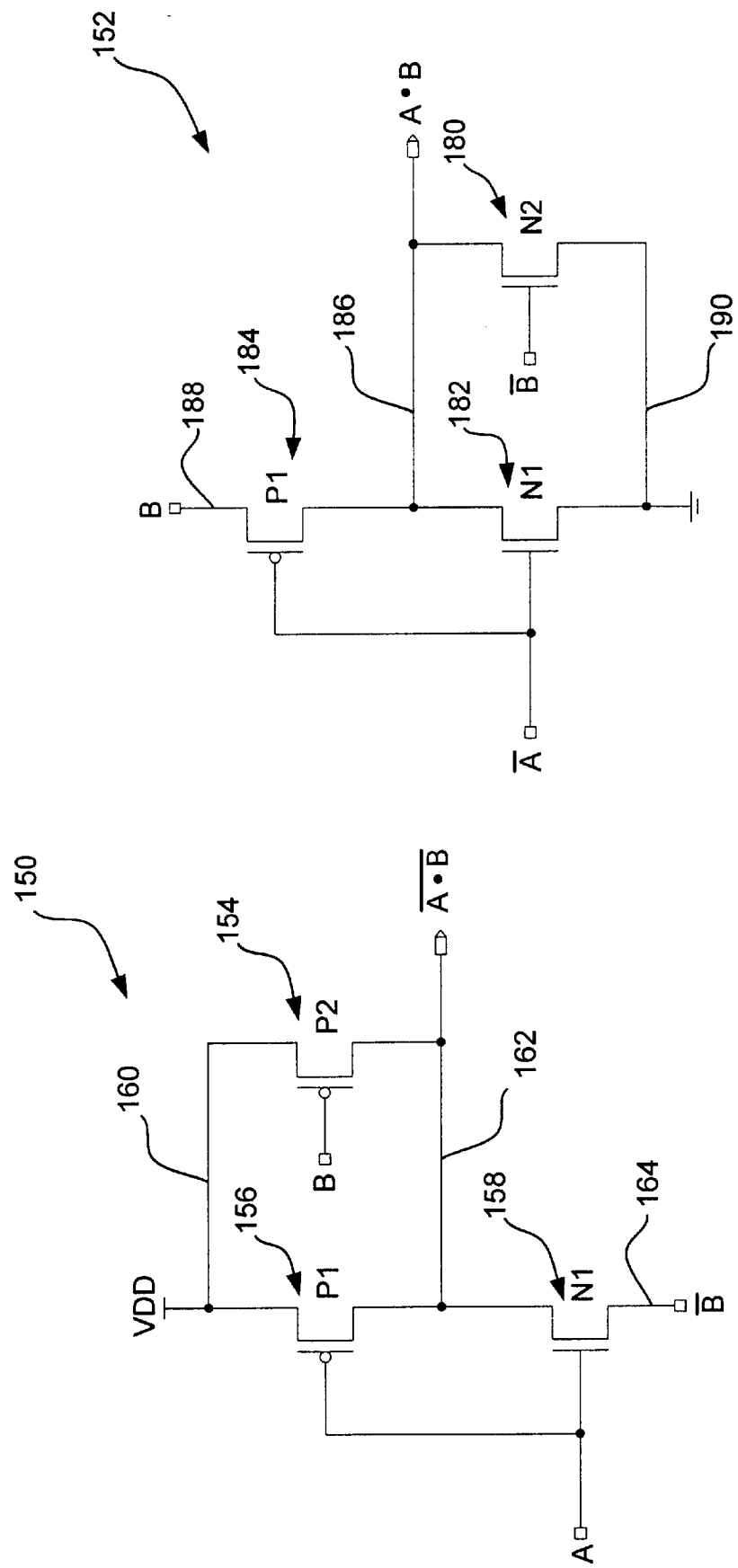
FIG. 2 is a schematic diagram of an illustrative two-input AND/NAND gate in accordance with the present invention.

FIG. 2 is a schematic diagram of an illustrative two-input AND/NAND gate in accordance with the present invention. The two-input NAND gate is shown generally at 150 and the two-input AND gate is generally shown at 152. The two-input NAND gate 150 includes two input signals A and B, along with the complement $\overline{B}$ of the B input signal. Thus, the illustrative the two-input NAND 150 gate actually has three input signals.

A first transistor 154 and a second transistor 156 are P-type transistors (e.g., PMOS), and a third transistor 158 is an N-type transistor (e.g., NMOS). The gate of the first transistor (P-type) 154 is coupled to input signal B, the source of the first transistor (P-type) 154 is coupled to the power supply voltage (VDD) 160, and the drain of the first transistor (P-type) 154 is coupled to the output 162 of the gate. The gate of the second transistor (P-type) 156 is coupled to input signal A, the source of the second transistor (P-type) 156 is coupled to the power supply voltage (VDD) 160, and the drain of the second transistor (P-type) 156 is coupled to the output 162 of the gate. Finally, the gate of the third transistor (N-type) 158 is coupled to input signal A, the source 164 of the third transistor (N-type) 158 is coupled to the complement $\overline{B}$ of the first input signal, and the drain of the third transistor (N-type) 158 is coupled to the output 162 of the gate, as shown.

Figure 1:
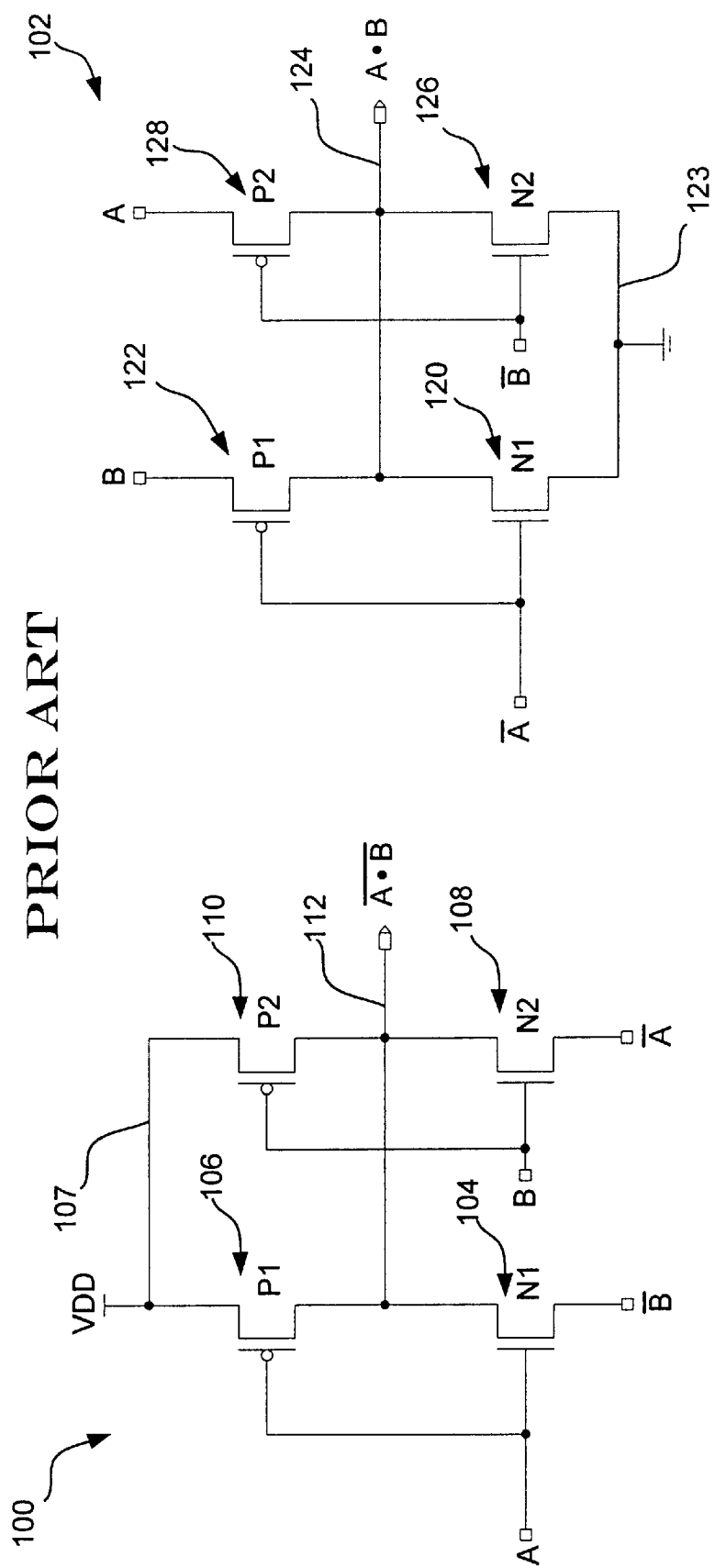
FIG. 1 is a schematic diagram of a prior art DPL two-input AND/NAND gate.

Unlike the conventional two-input DPL NAND gate 100 shown in FIG. 1, the illustrative two-input NAND gate does not include NMOS transistor 108 of FIG. 1. Accordingly, the illustrative two-input NAND gate may provide the same logic function as the DPL NAND gate 100 shown in FIG. 1, but with fewer transistors. Simulations have shown that the illustrative two-input NAND gate of the present invention may not only occupy less physical space, but may also operate at higher speeds while still providing gain.

When both inputs A and B are low, the first transistor (P-type) 154 and the second transistor (P-type) 156 are "on", and the third transistor (N-type) 158 is "off". As such, the first transistor (P-type) 154 and the second transistor (P-type) 156 pulls the output 162 of the NAND gate high.

When input A is low and input B is high, the first transistor (P-type) 154 is "off", the second transistor (P-type) 156 is "on", and the third transistor (N-type) 158 is "off". As such, the second transistor (P-type) 156 pulls the output 162 of the NAND gate high.

When input A is high and input B is low, the first transistor (P-type) 154 is "on", the second transistor (P-type) 156 is "off", and the third transistor (N-type) 158 is "on". As such, the first transistor (P-type) 154 pulls the output 162 of the NAND gate high. In addition, however, the source 164 of the third transistor (N-type) 158 is high because it is coupled to the complement $\overline{B}$ of input B. Accordingly, the third transistor (N-type) 158 helps pull the output 162 of the NAND gate high.

Finally, when input A is high and input B is high, the first transistor (P-type) 154 is "off", the second transistor (P-type) 156 is "off", and the third transistor (N-type) 158 is "on". The source 164 of the third transistor (N-type) 158 is low because it is coupled to the complement $\overline{B}$ of input B. As such, the third transistor (N-type) 158 pulls the output 162 of the NAND gate low. It has been found that the illustrative two-input NAND gate is faster than the conventional DPL two-input NAND gate shown in FIG. 1.

Referring now to the two-input AND gate 152 of FIG. 2. The two-input AND gate 152 includes two complement input signals $\overline{A}$ and $\overline{B}$, along with the input signal B. As such, the illustrative the two-input AND gate 152 actually has three input signals $\overline{A}$, $\overline{B}$ and B.

A first transistor 180 and a second transistor 182 are N-type transistors (e.g., PMOS), and a third transistor 184 is a P-type transistor (e.g., PMOS). The gate of the first transistor (N-type) 180 is coupled to input signal $\overline{B}$, the source of the first transistor (N-type) 180 is coupled to the power supply voltage (GND) 190, and the drain of the first transistor (N-type) 180 is coupled to the output 186 of the gate. The gate of the second transistor (N-type) 182 is coupled to input signal $\overline{A}$, the source of the second transistor (N-type) 182 is coupled to the power supply voltage (GND) 190, and the drain of the second transistor (N-type) 182 is coupled to the output 186 of the gate. Finally, the gate of the third transistor (P-type) 184 is coupled to input signal $\overline{A}$, the source 188 of the third transistor (P-type) 184 is coupled to the input signal B, and the drain of the third transistor (P-type) 184 is coupled to the output 186 of the gate.

Again, unlike the conventional two-input DPL AND gate 102 shown in FIG. 1, the illustrative two-input AND gate does not include PMOS transistor 128 of FIG. 1. Accordingly, the illustrative two-input AND gate may provide the same logic function as the DPL AND gate 102 shown in FIG. 1, but with fewer transistors. Simulations have shown that the illustrative two-input AND gate of the present invention not only may occupy less physical space, but may also operate at higher speeds while still providing gain.

When both inputs A and B are low ($\overline{A}$ and $\overline{B}$ are high), the first transistor (N-type) 180 and the second transistor (N-type) 182 are "on", and the third transistor (P-type) 184 is "off". As such, the first transistor (N-type) 180 and the second transistor (N-type) 182 pull the output 186 of the AND gate low.

When input A is low and input B is high ($\overline{A}$ is high and $\overline{B}$ is low), the first transistor (N-type) 180 is "off", the second transistor (N-type) 182 is "on", and the third transistor (P-type) 184 is "off". As such, the second transistor (N-type) 182 pulls the output 186 of the AND gate low.

When input A is high and input B is low ($\overline{A}$ is low and $\overline{B}$ is high), the first transistor (N-type) 180 is "on", the second transistor (N-type) 182 is "off", and the third transistor (P-type) 184 is "on". As such, the first transistor (N-type) 180 pulls the output 186 of the AND gate low. In addition, the source 188 of the third transistor (P-type) 184 is low because it is coupled to B, which is the complement $\overline{B}$ which is high. Accordingly, the third transistor (P-type) 184 also helps pull the output 186 of the AND gate low.

Finally, when input A is high and input B is high ($\overline{A}$ is low and $\overline{B}$ is low), the first transistor (N-type) 180 is "off", the second transistor (N-type) 182 is "off", and the third transistor (P-type) 184 is "on". The source 188 of the third transistor (P-type) 184 is now high, because it is coupled to B, which is the complement $\overline{B}$ which is low. As such, the third transistor (P-type) 184 pulls the output 186 of the AND gate high. It has been found that the illustrative two-input AND gate is faster than the conventional DPL two-input AND gate shown in FIG. 1.

Figure 3:
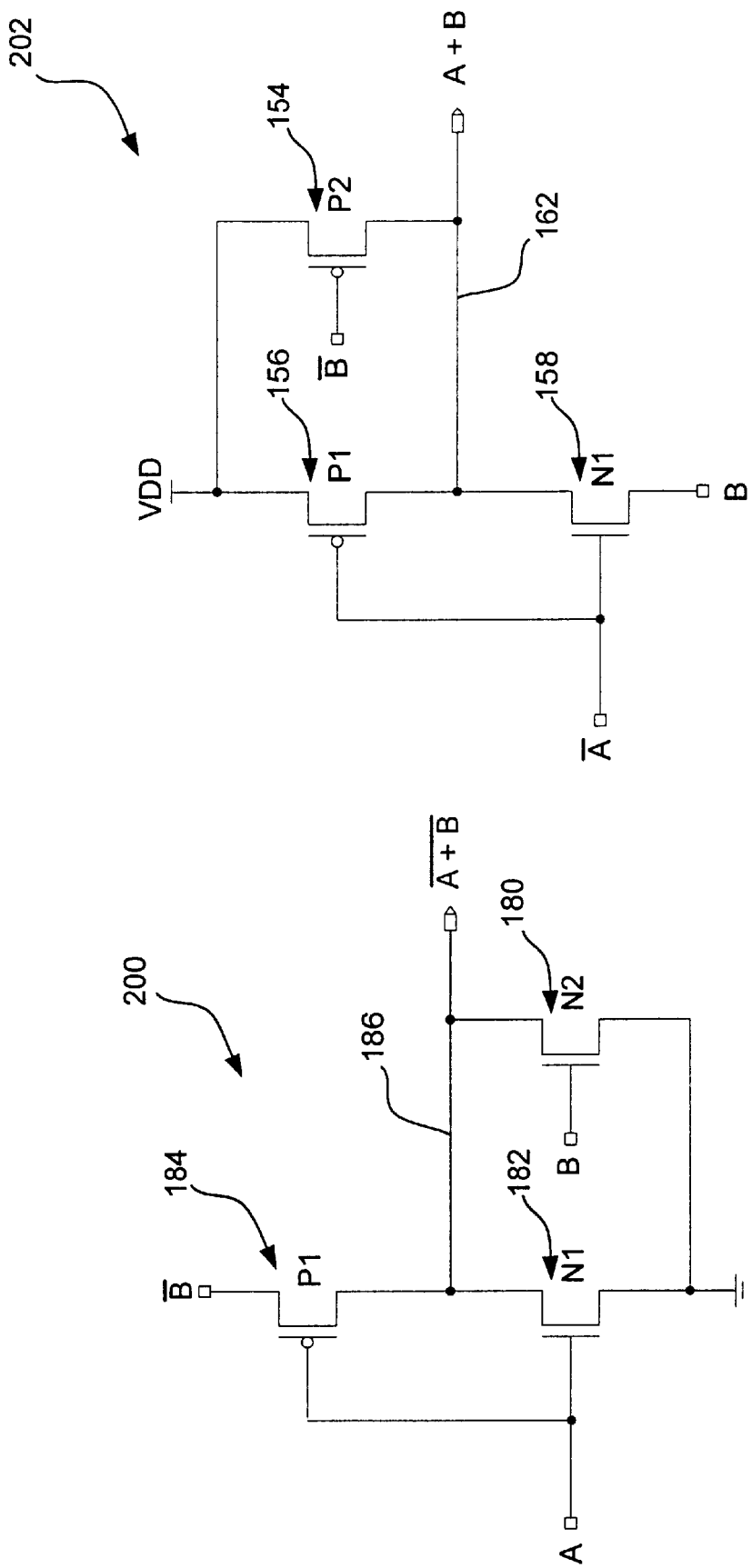
FIG. 3 is a schematic diagram of an illustrative two-input OR/NOR gate in accordance with the present invention.

FIG. 3 is a schematic diagram of an illustrative two-input OR/NOR gate in accordance with the present invention. The two-input NOR gate is shown generally at 200 and the two-input OR gate is generally shown at 202. The two-input NOR gate 200 includes two input signals A and B, along with the complement $\overline{B}$ of the B input signal. The two-input OR gate 202 includes two input signals $\overline{A}$ and $\overline{B}$, along with the input signal B. Accordingly, each of the illustrative two-input NOR gate 200 and two-input OR gate 202 actually have three input signals.

The illustrative two-input NOR gate 200 is identical to the two-input AND gate described above with reference to FIG. 2 except the polarity of the input signals are reversed. That is, the input signal A is provided to the gates of the second transistor (N-type) 182 and the third transistor (P-type) 184. Likewise, the input signal B is provided to the gate of the first transistor (N-type) 180. Finally, the complement of the input signal B ($\overline{B}$) is provided to the source of the third transistor (P-type) 184. This arrangement provides the NOR (A NOR B) function.

The illustrative two-input OR gate 202 is identical to the two-input NAND gate described above with reference to FIG. 2 except the polarity of the input signals are reversed. That is, the complement of the input A ($\overline{A}$) is provided to the gates of the second transistor (P-type) 156 and the third transistor (N-type) 158. Likewise, the complement of the input B ($\overline{B}$) is provided to the gate of the first transistor (P-type) 154. Finally, the input signal B is provided to the source of the third transistor (N-type) 158. This arrangement provides the OR (A OR B) function.

Figure 4:
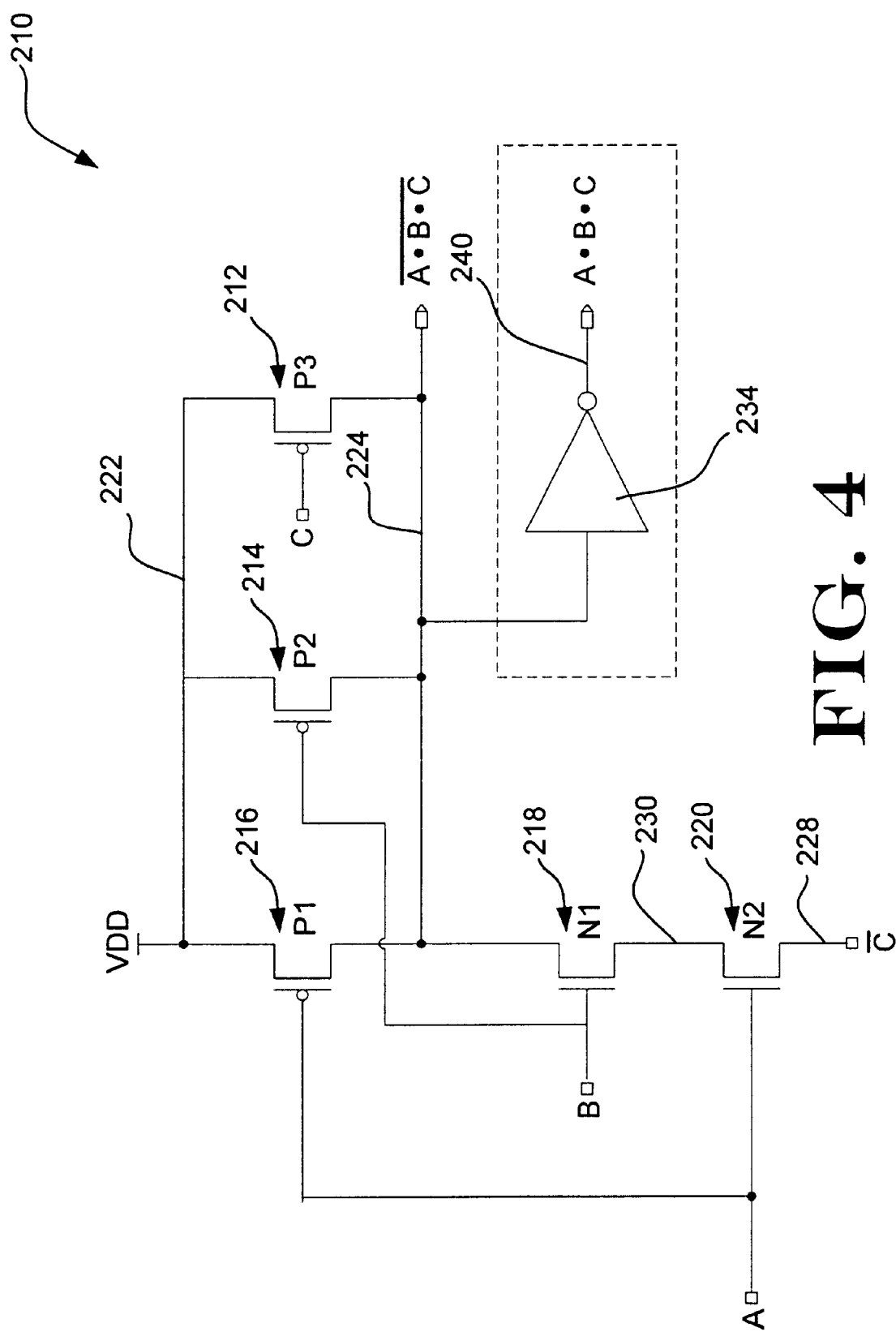
FIG. 4 is a schematic diagram of an illustrative three-input AND/NAND gate in accordance with the present invention.

FIG. 4 is a schematic diagram of an illustrative three-input AND/NAND gate in accordance with the present invention. The three-input NAND gate is shown generally at 210, and includes three input signals A, B and C, along with the complement $\overline{C}$ of the C input signal. Thus, the illustrative the three-input NAND gate 210 actually has four input signals.

A first transistor 212, a second transistor 214, and a third transistor 216 are P-type transistors (e.g., PMOS), and a fourth transistor 218 and a fifth transistor 220 are N-type transistors (e.g., NMOS). The gate of the first transistor (P-type) 212 is coupled to input signal C, the source of the first transistor (P-type) 212 is coupled to the power supply voltage (VDD) 222, and the drain of the first transistor (P-type) 212 is coupled to the output 224 of the gate. The gate of the second transistor (P-type) 214 is coupled to input signal B, the source of the second transistor (P-type) 214 is coupled to the power supply voltage (VDD) 222, and the drain of the second transistor (P-type) 214 is coupled to the output 224 of the gate. The gate of the third transistor (P-type) 216 is coupled to input signal A, the source of the third transistor (P-type) 216 is coupled to the power supply voltage (VDD) 222, and the drain of the third transistor (P-type) 216 is coupled to the output 224 of the gate.

The gate of the fourth transistor (N-type) 218 is coupled to input signal B, and the drain of the fourth transistor (N-type) 218 is coupled to the output 224 of the gate. Finally, the gate of the fifth transistor (N-type) 220 is coupled to input signal A, the source 228 of the fifth transistor (N-type) 220 is coupled to the complement $\overline{C}$ of the input signal C, and the drain of the fifth transistor (N-type) 220 is coupled to the source 230 of the fourth transistor (N-type) 218, as shown.

As in FIG. 2, it is contemplated that a separate three-input AND gate may be provided to generate an AND output. However, in the embodiment shown, an inverter 234 is coupled to the output 224 of the NAND gate. This produces an overall NAND/AND function that has fewer transistors than the approach shown in FIG. 2. However, the inverter 234 introduces an extra gate delay when producing the AND output 240. The particular approach used will depend on the desired application.

The above-described logic circuits are only meant to be illustrative. With the accompanying disclosure, one skilled in the art can derive numerous other logic functions, including storage elements, to form a logic family.

Figure 5:
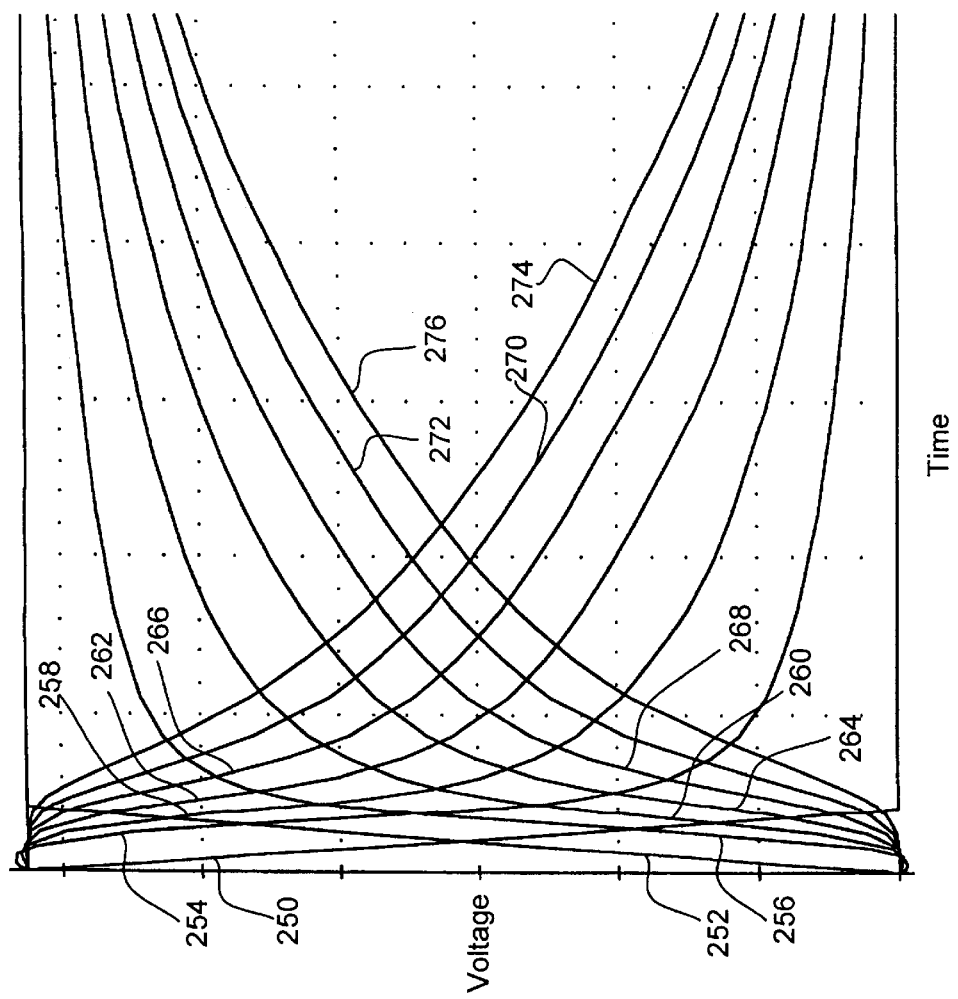
FIG. 5 is a graph showing illustrative output signals for each stage of a series string of pass-transistor logic gates.

FIG. 5 is a graph showing illustrative output signals for each stage of a series string of pass-transistor logic gates, such as CPL gates. Complementary input signals I 250 and $\overline{I}$ 252 are provided to the input terminals of a first stage in the string of pass-transistor logic gates. The complementary outputs $O_1$ and $\overline{O}_1$ of the first stage are shown at 254 and 256, respectively. These complementary outputs $O_1$ 254 and $\overline{O}_1$ 256 are provided to the input terminals of a second stage in the string of pass-transistor logic gates.

The complementary outputs $O_2$ and $\overline{O}_2$ of the second stage are shown at 258 and 260, respectively. These complementary outputs $O_2$ 258 and $\overline{O}_2$ 260 are provided to the input terminals of a third stage in the string of pass-transistor logic gates. The complementary outputs $O_3$ and $\overline{O}_3$ of the third stage are shown at 262 and 264, respectively. These complementary outputs $O_3$ 262 and $\overline{O}_3$ 264 are provided to the input terminals of a fourth stage in the string of pass-transistor logic gates.

The complementary outputs $O_4$ and $\overline{O}_4$ of the fourth stage are shown at 266 and 268, respectively. These complementary outputs $O_4$ 266 and $\overline{O}_4$ 268 are provided to the input terminals of a fifth stage in the string of pass-transistor logic gates. The complementary outputs $O_5$ and $\overline{O}_5$ of the fifth stage are shown at 270 and 272, respectively. These complementary outputs $O_5$ 270 and $\overline{O}_5$ 272 are provided to the input terminals of a sixth stage in the string of pass-transistor logic gates. Finally, the complementary outputs $O_6$ and $\overline{O}_6$ of the sixth stage are shown at 274 and 276, respectively.

As can be seen, the output signals produced by each stage of the gates tend to become successively more degraded. Both the slope and amplitude of the output signals are reduced, which can impact the performance and noise margins of the circuit. The degradation in the output signals illustrates the lack of gain produced by each pass-transistor logic gate. To overcome this limitation, amplifier stages are commonly inserted at various locations in the delay path. This, however, decreases both the performance and density of the circuit.

Figure 6:
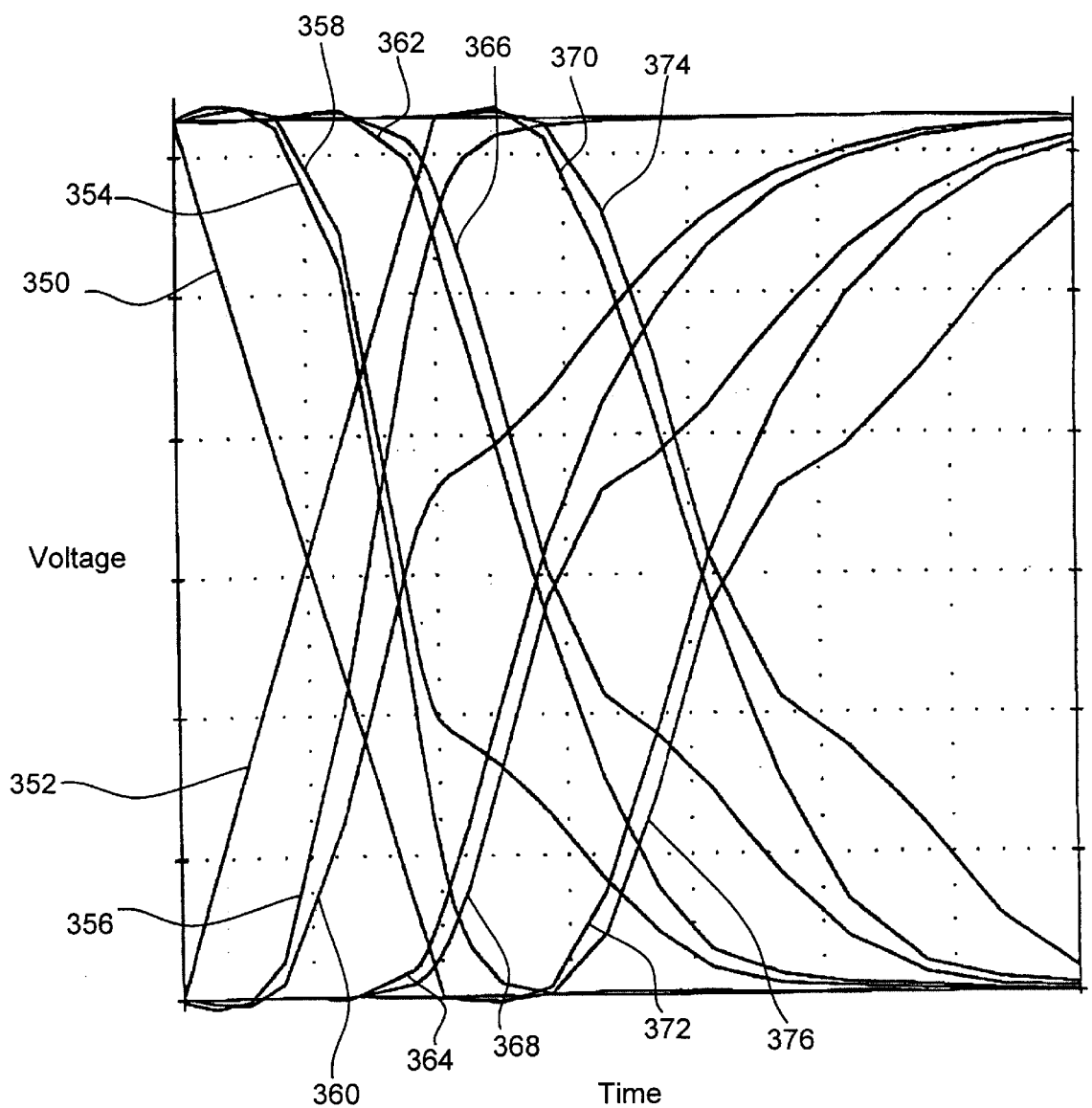
FIG. 6 is a graph showing illustrative output signals for each stage of a series string of logic gates constructed in accordance with the present invention.

FIG. 6 is a graph showing illustrative output signals for each stage of a series string of AND/NAND gates constructed in accordance with FIG. 2 above. Complementary input signals I 350 and $\overline{I}$ 352 are provided to the input terminals of a first stage in the string of gates. The complementary outputs $O_1$ and $\overline{O}_1$ of the first stage are shown at 354 and 356, respectively. These complementary outputs $O_1$ 354 and $\overline{O}_1$ 356 are provided to the input terminals of a second stage in the string of gates.

The complementary outputs $O_2$ and $\overline{O}_2$ of the second stage are shown at 358 and 360, respectively. These complementary outputs $O_2$ 358 and $\overline{O}_2$ 360 are provided to the input terminals of a third stage in the string of gates. The complementary outputs $O_3$ and $\overline{O}_3$ of the third stage are shown at 362 and 364, respectively. These complementary outputs $O_3$ 362 and $\overline{O}_3$ 364 are provided to the input terminals of a fourth stage in the string of gates.

The complementary outputs $O_4$ and $\overline{O}_4$ of the fourth stage are shown at 366 and 368, respectively. These complementary outputs $O_4$ 366 and $\overline{O}_4$ 368 are provided to the input terminals of a fifth stage in the string of gates. The complementary outputs $O_5$ and $\overline{O}_5$ of the fifth stage are shown at 370 and 372, respectively. These complementary outputs $O_5$ 370 and $\overline{O}_5$ 372 are provided to the input terminals of a sixth stage in the string of gates. Finally, the complementary outputs $O_6$ and $\overline{O}_6$ of the sixth stage are shown at 374 and 376, respectively.

As can be seen, the output signals produced by each stage of the string of gates of the present invention do not become significantly degraded. Both the slope and amplitude of the various output signals tend to remain relatively constant. This indicates that the logic gates of the present invention produce gain, much like a CMOS gate. Accordingly, logic gates constructed in accordance with the present invention may have increased performance and increased noise margins relative the standard pass-transistor logic families such as CPL. In addition, and because the logic gates of the present invention have fewer transistors than standard CMOS gates, the logic gates of the present invention may have increased performance and increased density relative to standard CMOS gates.

Having thus described the preferred embodiments of the present invention, those of skill in the art will readily appreciate that the teachings found herein may be applied to yet other embodiments within the scope of the claims hereto attached.

What is claimed is:

1. A logic circuit having an output comprising:
    a first transistor with a first polarity having a source, a drain and a gate, the source of the first transistor is coupled to a power supply voltage, the drain of the first transistor is coupled to the output of the logic circuit, and the gate of the first transistor is coupled to a first input signal;
    a second transistor with the first polarity having a source, a drain and a gate, the source of the second transistor is coupled to the power supply voltage, the drain of the second transistor is coupled to the output of the logic circuit, and the gate of the second transistor is coupled to a second input signal;
    a third transistor with a second polarity having a source, a drain and a gate, the source of the third transistor is coupled to a third input signal, the drain of the third transistor is coupled to the output of the logic circuit, and the gate of the third transistor is coupled to the first input signal; and
    the logic circuit not having a fourth transistor with a source, a drain and a gate, with the source coupled to the complement of the first input signal, the drain coupled to the output of the logic circuit, and the gate coupled to the second input signal.

2. A logic circuit according to claim 1, wherein the third input signal is the complement of the second input signal.

3. A logic circuit according to claim 2, wherein the first transistor has a P-type polarity.

4. A logic circuit according to claim 3, wherein the second transistor has a P-type polarity.

5. A logic circuit according to claim 4, wherein the third transistor has a N-type polarity.

6. A logic circuit according to claim 5, wherein the power supply voltage is VDD.

7. A logic circuit according to claim 2, wherein the first transistor has a N-type polarity.

8. A logic circuit according to claim 7, wherein the second transistor has a N-type polarity.

9. A logic circuit according to claim 8, wherein the third transistor has a P-type polarity.

10. A logic circuit according to claim 9, wherein the power supply voltage is ground.

11. A logic circuit according to claim 2, wherein the source of the third transistor is coupled to the third input signal through one or more other transistors of the second polarity type.

12. A logic circuit according to claim 11, wherein each of the other transistors has a gate that is coupled to a corresponding other input signal.

13. A logic circuit according to claim 12, further comprising one or more other transistors of the first polarity type each having a gate, a source and a drain, the source of each of the other transistors of the first polarity type is coupled to the power supply voltage, the drain of each of the other transistors of the first polarity type is coupled to the output of the logic circuit, and the gate of each of the other transistors of the first polarity type is coupled a corresponding one of the other input signals.

14. A logic circuit having an output comprising:
    a first transistor with a first polarity having a source, a drain and a gate, the source of the first transistor is coupled to a power supply voltage, the drain of the first transistor is coupled to the output of the logic circuit, and the gate of the first transistor is coupled to a first input signal;
    a second transistor with the first polarity having a source, a drain and a gate, the source of the second transistor is coupled to the power supply voltage, the drain of the second transistor is coupled to the output of the logic circuit, and the gate of the second transistor is coupled to a second input signal;
    a third transistor with the first polarity having a source, a drain and a gate, the source of the third transistor is coupled to the power supply voltage, the drain of the third transistor is coupled to the output of the logic circuit, and the gate of the third transistor is coupled to a third input signal;
    a fourth transistor with a second polarity having a source, a drain and a gate, the drain of the fourth transistor is coupled to the output of the logic circuit, and the gate of the fourth transistor is coupled to the second input signal;
    a fifth transistor with the second polarity having a source, a drain and a gate, the source of the fifth transistor is coupled to a fourth input signal, the drain of the fifth transistor is coupled to the source of the fourth transistor, and the gate of the fifth transistor is coupled to the first input signal; and
    the logic circuit not having a sixth transistor with a source, a drain and a gate, with the source coupled to the complement of the first or second input signals, the drain coupled to the output of the logic circuit, and the gate coupled to the first, second or third input signals.

15. A logic circuit according to claim 14, wherein the fourth input signal is the complement of the third input signal.

16. A logic circuit according to claim 15, wherein the first transistor, the second transistor and the third transistor have a P-type polarity.

17. A logic circuit according to claim 16, wherein the fourth transistor and the fifth transistor have a N-type polarity.

18. A logic circuit according to claim 17, wherein the power supply voltage is VDD.

19. A logic circuit according to claim 15, wherein the first transistor, the second transistor and the third transistor have a N-type polarity.

20. A logic circuit according to claim 19, wherein the fourth transistor and the fifth transistor have a P-type polarity.

21. A logic circuit according to claim 20, wherein the power supply voltage is ground.

22. A method for performing a logic function on one or more input signals, the method comprising the steps of:
    selectively coupling an output terminal to a power supply voltage when either a first input signal or a second input signal is in a first logic state;
    selectively coupling the output terminal to a third input signal when the first input signal is in a second logic state, wherein the third input signal is the complement of the second input signal; and
    not selectively coupling the output terminal to a fourth input signal when the second input signal is in the second logic state, wherein the fourth input signal is the complement of the first input signal.

23. A method according to claim 22, wherein the power supply voltage is VDD.

24. A method according to claim 22, wherein the output terminal is coupled to the third input signal through one or more other transistors.

* * * * *